United States Patent
Visca et al.

(10) Patent No.: US 7,306,747 B2
(45) Date of Patent: Dec. 11, 2007

(54) USE OF FLUORINATED ADDITIVES IN THE ETCHING OR POLISHING OF INTEGRATED CIRCUITS

(75) Inventors: Mario Visca, Alessandria (IT); Alba Chittofrati, Novara (IT); Fiorenza D'Aprile, Milan (IT)

(73) Assignee: Solvay Solexis S.p.A., Milan (IT)

( * ) Notice: Subject to any disclaimer, the term of this patent is extended or adjusted under 35 U.S.C. 154(b) by 0 days.

(21) Appl. No.: 10/355,072

(22) Filed: Jan. 31, 2003

(65) Prior Publication Data
US 2003/0146404 A1  Aug. 7, 2003

(30) Foreign Application Priority Data
Feb. 1, 2002  (IT) .......................... MI2002A0178

(51) Int. Cl.
*B44C 1/22* (2006.01)
(52) U.S. Cl. .................. 216/88; 216/89; 252/79.1; 252/79.2; 252/79.3; 252/79.4
(58) Field of Classification Search ................ 216/88, 216/89; 510/218; 106/2, 13; 252/79.1–79.5
See application file for complete search history.

(56) References Cited

U.S. PATENT DOCUMENTS

| | | | |
|---|---|---|---|
| 3,810,874 A | 5/1974 | Mitsch et al. ................ 528/70 |
| 4,517,106 A | 5/1985 | Hopkins et al. | |
| 5,466,389 A * | 11/1995 | Ilardi et al. ................ 510/175 |
| 5,755,989 A * | 5/1998 | Ishii et al. ................ 252/79.4 |
| 5,998,521 A * | 12/1999 | Fan et al. ................ 524/225 |
| 6,027,571 A | 2/2000 | Kikuyama et al. ............ 134/3 |
| 6,174,817 B1 | 1/2001 | Doshi et al. ................ 438/706 |
| 6,178,585 B1 | 1/2001 | Cadien et al. | |
| 6,184,134 B1 | 2/2001 | Chaudhary et al. ......... 438/669 |
| 6,211,527 B1 | 4/2001 | Chandler | |
| 2001/0031712 A1* | 10/2001 | Ziganke et al. ............. 510/218 |

FOREIGN PATENT DOCUMENTS

| | | |
|---|---|---|
| EP | 0 133 584 A1 | 2/1985 |
| JP | 3-53083 A | 3/1991 |
| WO | 00/72367 A | 11/2000 |

OTHER PUBLICATIONS

Preparation, Properties and Industrial Applications of Organofluorine Compounds—R. E. Bank, Ellis Horwood "no date available".

Chittofrati et al: Perfluoropolyether Carboxylic Salts In Micellar Solution And O/W Microemulsions; 15$^{th}$ Meeting of the European Colloid and Interface Society (ECIS); Progress In Colloid and Polymer Science vol. 123; Springer-Verlag Berlin; Germany; 2004; pp. 23-27; XP008071959.

* cited by examiner

*Primary Examiner*—Shamim Ahmed
(74) *Attorney, Agent, or Firm*—Arent Fox LLP

(57) ABSTRACT

Use in etching or polishing of integrated circuits of fluorinated additives of formula (I):

$$T'(C_3F_6O)_n(CFXO)_mT \qquad (I)$$

having a number average molecular weight in the range 250–400, in particular of the compound $Cl(CF_2-CF(CF_3)O)_nCF_2COONa$.

6 Claims, No Drawings

USE OF FLUORINATED ADDITIVES IN THE ETCHING OR POLISHING OF INTEGRATED CIRCUITS

The present invention relates to additives to be used in the etching and polishing treatments in the semicon industry.

More specifically it relates to the use of additives in the above treatments allowing to obtain semicons having smoother surfaces and lower roughness and which result easily removable with washing with water of the treated surfaces.

In the manufacture of integrated circuits (IC) or chips a combined chemical and mechanical etching and polishing process of silicon wafer surfaces is used. Said process allows to level the wafer surface after the connection metal circuits have been deposited thereon. Various layers of said wafer are overlapped after an insulant layer has been deposited thereon and subsequently connected to the doped silicon base.

The compositions used in the etching and polishing process i.e. for the chemical-mechanical levelling (CMP) are formed by aqueous solutions dispersions having an acid or basic pH containing particles with controlled sizes of silicon oxide. The levelling degree at present obtainable is of some tenths of micron, and depends on the etching and polishing solution properties.

The etching and polishing solutions used in the prior art allow to obtain wafers having a levelling degree such to allow the formation of chips having up to three overlapped circuit levels. Chips containing up to six levels of electrical connections are known, even though only on a research level. The increase from 8,000 to 80,000 transistors/cm$^2$ expected for the year 2012 will require the industrial IC development up to 9 overlapped circuit levels. So complex chips will require connection circuits having a levelling degree below one micron tenth.

The slurries used for the chemical-mechanical levelling (CMP) of thin oxide films used in the manufacturing of integrated circuits comprise an oxidizing agent and abrasive solid particles having a pH comprised between 2 and 4. Said dispersions can also be used for the lapping of the copper conductors used in semicons. See for example U.S. Pat. No. 6,178,585.

To obtain a high levelling degree of the treated oxide surfaces, also etching-polishing solutions or dispersions containing surfactants are used.

So for example according to U.S. Pat. No. 6,027,571 an irregular corrosion of oxide films on the integrated circuits is avoided by addition of surfactants to a HF and ammonium fluoride etching solution. As surfactants mixtures of aliphatic surfactants are used.

At the end of the etching and polishing treatments, the used solutions must be completely removed to avoid that compounds which result polluting for the successive treatment processes and/or harmful for the integrated circuit operation remain on the surface of the oxide films. See U.S. Pat. No. 6,174,817, for example, wherein aqueous washings are carried out to remove HF.

The removal of the polluting substances can be very complicated depending on the pollutant nature which can be organic, inorganic or polymeric. In U.S. Pat. No. 6,184,134, for example, to remove the residues (including those organic, inorgnic or polymeric) after the metal etching from wafer semicons, solutions of ammonium hydroxide and hydrogen peroxide are used followed by a treatment with a reactive fluorinated gas to form volatile compounds in the presence of radiofrequencies and lastly by a stripping with plasma at low temperature.

It is necessary to note that in the above wafer treatments, using surfactants in the etching or polishing solutions or suspensions, the surfactants show the drawback to result not easily removable from the wafer surfaces by simple methods such for example rinsing with water. This is particularly true when fluorinated surfactants are used. This has been found by tests carried out by the Applicant from which it results that their complete removal is not possible with washings with water (see the Examples).

The need was therefore felt to have available additives capable to confer to etching or polishing solutions or dispersions used in the semicon industry a high wetting power for the surfaces to be treated and being then easily removable for rinsing with water.

Fluorinated additives have been surprisingly and unexpectdly found which used in etching or polishing solutions or dispersions satisfy the above requirements.

An object of the present invention is therefore the use in the etching or polishing treatments of integrated circuits of additives of formula:

$$T'(C_3F_6O)_n(CFXO)_mT \qquad (I)$$

wherein:

T'=YR$_f$(O)$_p$ wherein Y=Cl, F, H; R$_f$=C$_3$F$_6$, C$_2$F$_4$, CF$_2$, preferably C$_3$F$_6$, p can be 0 or 1, n can be 0 or 1, m is an integer selected from 0, 1, 2, when p=0 also m, n=0

X=F, CF$_3$,

T=—CF$_2$COOM or —CF$_2$SO$_3$M with M=H, ammonium or a metal ion.

Preferably the number average molecular weight of the compound (I) is in the range 250–400.

The —C$_3$F$_6$— group can be linear or branched as —(CF$_2$)$_3$—, —CF$_2$—CF(CF$_3$)—, —CF(CF$_3$)CF$_2$—.

Among the additives, for example compounds of formula C$_4$F$_9$SO$_3$M can be used, wherein the C$_4$F$_9$— group is preferably linear and the compound of formula:

$$Cl(CF_2\text{—}CF(CF_3)O)_nCF_2COOM \qquad (II)$$

wherein M has the above meaning and n=1.

The formula (II) compounds are preferred and as such they form a further object of the present invention.

As M ions, ammonium or metal ions of the I group of the periodic system, such as Li, Na or K, are preferably used.

It has been unexpectedly found that the formula (I) compounds when used as additives of etching or polishing solutions or suspensions confer to the latter a high wetting power for the surfaces to be treated and are then easily removable by washings with water. They can be used in amounts between 0.01 g/l and 100 g/l, preferably 0.05 and 50 g/l.

3–5 water washing cycles are sufficient to completely remove the additive. This represents a significant and unexpected advantage both from the operating and economic point of view.

A further advantage connected to the use of the invention additives is due to the fact that the adhesion to the treated surfaces of the solid particles present in the etching/polishing solutions or suspensions or possibly forming in the aforesaid treatments is substantially reduced.

The invention additives show furthermore poor wetting properties when used in solutions having a low ionic force as the weakly saline solutions or water but differently from the known surfactants, they show high wetting properties in solutions having a high ionic force as those used in the etching/polishing treatments.

It has been furthermore found that the formula (I) additives having n higher than 1 confer to the ethcing/polishing solutions or suspensions poor wettability properties and are hardly removable.

The invention compounds can be obtained with various processes. In particular the formula (II) additives are prepared by photooxidation of hexafluoropropene (HFP) in the presence, up to 20% by moles, of chlorotrifluoroethylene (CTFE) with gaseous $O_2$ and with UV irradiation between $-20°$ C. and $100°$ C., obtaining chloroperfluoropolyethers having COF end groups and containing peroxidic groups, and subsequent thermal treatment at $180°–220°$ C. and/or photochemical with UV of said chloroperfluoropolyethers to decompose the peroxidic groups and obtain a reaction mixture from which by fractional distillation the compounds of formula

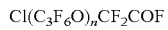
$Cl(C_3F_6O)_nCF_2COF$ are separated, wherein n=1. The compounds of formula (II) are obtained by hydrolysis and subsequent saliication of the above compounds.

The formula (I) product wherein p=1 and Y=—$SO_3H$ can be prepared starting from precursors having —$CH_2SO_2Cl$ end group described in U.S. Pat. No. 3,810,874, by fluorination and subsequent hydrolysis and salification to obtain the sulphonic acid or salts thereof.

The formula (I) compounds wherein p=0 can be prepared by electrochemical fluorination of hydrogenated precursors as described in "Preparation, Properties and Industrial Applications of Organofluorine Compounds" edited by R. E. Banks, Ellis Horwood Ltd, 1982, and subsequent hydrolysis to obtain the sulphonic acid or salts thereof.

The following Examples are given for merely exemplifying purposes and are not limitative of the invention.

EXAMPLES

Example 1

Surface Tensions of the Invention Additive

The surface tensions of aqueous solutions having different saline concentrations of $Ca(NO_3)_2$ and different pHs are determined, obtained by addition of suitale amounts of NaOH, having a concentration equal to 10 g/l of sodic salt of the formula (II) compound with number average molecular weight equal to 319.

The surface tension and dynamic contact angle measurements have been carried out at $25°$ C., according to the ASTM D 1331-89 method, using a De Nouy, SIGMA 70 ring tensiometer by KSV. The results are reported in Table 1.

TABLE 1

| Surface tension γ (mN/m) of solutions at 10 g/l of additive (II) | | | |
|---|---|---|---|
| Solvent | Water | $Ca(NO_3)_2$ 1 M | $Ca(NO_3)_2$ 0.5 M |
| γ (pH = 7.5) | 30 mN/m | 18 mN/m | — |
| γ (pH = 9.4) | 31 mN/m | 18 mN/m | 18 mN/m |

It is noticed the efficiency of the compound (II) salt in lowering the surface tension, in the presence of salts.

Example 2 (Comparative)

The measurements reported in Example 1 are carried out by using as a comparison a mixture formed by sodic salts of the acids having a perfluoropolyether structure of formula (III)

$Cl(C_3F_6O)_nCF_2COOH$     (III)

formed by 60% by weight of molecules wherein n=2 and by 40% by weight of molecules wherein n=3 having a number average molecular weight equal to 500. The results are reported in Table 2.

TABLE 2

| Surface tension γ (mN/m) of solutions at 10 g/l of comparative additive | | | |
|---|---|---|---|
| Solvent | Water | $Ca(NO_3)_2$ 1 M | $Ca(NO_3)_2$ 0.5 M |
| γ (pH = 7.5) | 20 mN/m | insoluble | — |
| γ (pH = 9.4) | 20 mN/m | insoluble | insoluble |

It is evident the impossibility to use the comparative mixture, at all the tested concentrations, in the saline solutions.

Example 3 (Comparative)

The measurements are carried out according to the procedures of Example 1 but using as additive the sodic salt of the perfluorooctanoic acid $C_7F_{15}COOH$. The results are reported in Table 3.

TABLE 3

| Surface tension γ (mN/m) of solutions at 10 g/l of comparative additive | | | |
|---|---|---|---|
| Solvent | Water | $Ca(NO_3)_2$ 1 M | $Ca(NO_3)_2$ 0.5 M |
| γ (pH = 7.5) | 19 mN/m | insoluble | — |
| γ (pH = 9.4) | 20 mN/m | insoluble | insoluble |

It is evident the impossibility to use the comparative surfactant in the saline solutions.

Example 4

Particle Removal

To check the effect of the salt of the compound having structure (II) on the adsorption and on the adhesion of silica particles and generally of metal oxides which can be formed in the chemical-mechanical polishing process of microchips, a silica dispersion ($SiO_2$) having submicronic size (micron tenths) having a concentration equal to 5 g/l has been prepared.

Two aliquots of the particle dispersion equal to 5 ml have been diluted respectively with deionized water and with deionized water containing the ammonium salt of compound (II) in such amounts as to obtain a silica concentration equal to 1 g/l and a salt concentration equal to 0.02 moles/l.

Two copper plaques, previously pickled with hydrochloric acid at 5%, rinsed with deionized water and carefully dried, have been immersed into the two dispersions.

By using the equipment of Example 1, the dynamic contact angle in deionized water has been determined on the two plaques after immersion into the two dispersions and subsequent drying at room temperature, compared to a clean copper plate, hereinafter indicated as copper as such, not immersed in the above described silica dispersions. The measurement has been carried out at 25° C. with a constant immersion speed of 6 mm/min, for 4 successive cycles of immersion-emersion.

The obtained advancing contact angle values are reported In Table 4. The significantly lower contact angle value, measured on the specimen treated in the $SiO_2$ dispersion in absence of the ammonium salt of compound (II) shows the presence of an hydrophilic impurity absent on the surface of the copper as such and of the copper previously immersed into the dispersion containing the ammonium salt of the compound (II).

Indeed the contact angles measured on the surface of the copper as such and of that previously immersed into the $SiO_2$ dispersion in the presence of the ammonium salt of compound (II) are substantially comparable each other for all measurement cycles and result higher than those measured on the copper plaque previously immersed into the silica dispersion.

TABLE 4

DYNAMIC CONTACT ANGLE (°)

| CYCLE | Copper as such | Copper treated in the presence of compound (II) salt | Copper treated in absence of compound (II) salt |
|---|---|---|---|
| 1 | 103 | 106 | 100 |
| 2 | 92 | 96 | 82 |
| 3 | 90 | 99 | 76 |
| 4 | 89 | 101 | 71 |
| average | 94 | 101 | 82 |

To confirm the results obtained from the measurement of the contact angles, the surfaces have been photographed by scanning electronic microscope SEM. The microphotographs SEM have shown the absence of particles on the surface of the metal as such and of that immersed into the dispersion containing the additive formed by the compound (II) salt.

The presence of adsorbed particles on the metal surface has on the contrary been noticed on the copper immersed into the dispersion free from the compound (II) salt.

Example 5

Determination of the Adsorption/Desorption of the Compound (II) Salt on Metal Surfaces Immersed into Solutions Having Different Saline Concentrations.

Copper plaques subjected to the polishing treatment reported in Example 4 have been immersed into a solution (limpid) 0.02M of ammonium salt of compound (II) and 1M of NaCl and dried at room temperature.

The dynamic contact angle has been determined, as peviously, both by immersion into deionized water and by immersion into a NaCl 0.1M solution and into a NaCl 1M solution.

The contact angle values measured under the different conditions are reported in Table 5.

It is noticed that the plaques show low contact angles at the first immersion cycle into water: the ammonium salt of compound (II) remains on the plaques.

The ammonium salt of compound (II) does not tend to desorb from the plaques in strongly saline solutions (low contact angle constant in all immersion cycles into saline solutions), but it tends to desorb by immersion into deionized water (increase of the contact angle as the number of immersion cycles into deionized water increases).

TABLE 5

| | CONTACT ANGLE (°) | | |
|---|---|---|---|
| CYCLE | Immersion into water | Immersion into NaCl 0.1 M | Immersione into NaCl 1 M |
| 1 | 36 | 46 | 52 |
| 2 | 76 | 53 | 49 |
| 3 | 97 | 49 | 50 |
| 4 | 105 | 49 | 48 |

Example 6 (Comparative)

Determination of the adsorption/desorption of the ammonium salt of compound of Example 2 with n=2 and number average molecular weight equal to 479, on metal surfaces immersed into solutions having different saline concentrations.

Copper plaques subjected to the polishing treatment reported in Example 4 have been immersed into a solution 0.02M of ammonium salt of compound (III) with n=2, and 1M NaCl. The solution is turbid and tends to separate a bottom body.

The dynamic contact angle has been determined, as previously, both by immersion into deionized water and by immersion into a solution 0.1M of NaCl.

The contact angles values measured under different conditions are reported in Table 6.

It is noticed that the plaques show low contact angles at the first cycle of immersion into water: the ammonium salt of compound (III) remains on the plaques.

The ammonium salt of compound (III) does not significantly desorb for successive immersion cycles into deionized water (contact angles<90° in all immersion cycles into water).

TABLE 6

| | CONTACT ANGLE (°) | |
|---|---|---|
| CYCLE | Immersion into water | Immersion into NaCl 0.1 M |
| 1 | 48 | 64 |
| 2 | 77 | 43 |
| 3 | 74 | 36 |
| 4 | 75 | 34 |

The invention claimed is:

1. Method for etching or polishing integrated circuits comprising treating the surface with etching or polishing additives of formula:

$$T'(C_3F_6O)_n(CFXO)_mT \qquad (I)$$

wherein:

$T'=YR_f(O)_p$ wherein Y=Cl, F, H; $R_f=C_3F_6$, $C_2F_4$, or $CF_2F_6$, p can be 0 or 1, n=1, m is an integer selected from 0, 1, 2,

X=F, $CF_3$,

T=—$CF_2$COOM or —$CF_2SO_3M$ with M=H, ammonium or a metal ion.

2. Method according to claim 1, wherein the additive has formula (II) $Cl(CF_2—CF(CF_3)O)_nCF_2COOM$ (II), wherein n=1.

3. Method according to claim 1, wherein the additives are used in amounts between 0.01 g/l and 100 g/l of the etching solution.

4. Method according to claim 1, wherein the additives have a number average molecular weight in the range 250–400.

5. Method according to claim 1, wherein $R_f=C_3F_6$.

6. Method according to claim 3, wherein the additives are used in amounts between 0.05 g/l and 50 g/l of the etching solution.

* * * * *